(12) United States Patent
Staraitis et al.

(10) Patent No.: US 6,594,184 B2
(45) Date of Patent: Jul. 15, 2003

(54) SYSTEM AND METHOD FOR ACCESSING A MEMORY ARRAY WHICH TOLERATES NON-EXCLUSIVE READ SELECT ENABLES

(75) Inventors: Julie M. Staraitis, Ayer, MA (US); Marc E. Lamere, Carlisle, MA (US); Jason Eisenberg, Mountain View, CA (US); Micah C. Knapp, Cambridge, MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/948,180

(22) Filed: Sep. 6, 2001

(65) Prior Publication Data

US 2003/0043617 A1 Mar. 6, 2003

(51) Int. Cl.$^7$ ................................................. G11C 7/00
(52) U.S. Cl. ................................................. 365/189.08
(58) Field of Search ........................... 365/189.08, 203, 365/230.03; 714/720

(56) References Cited

U.S. PATENT DOCUMENTS

| | | | | |
|---|---|---|---|---|
| 5,398,206 A | * | 3/1995 | Akizawa et al. | 365/230.03 |
| 5,477,484 A | * | 12/1995 | Nakashima | 365/203 |
| 5,880,990 A | * | 3/1999 | Miura | 365/203 |
| 5,940,332 A | * | 8/1999 | Artieri | 365/189.08 |
| 6,286,116 B1 | * | 9/2001 | Bhavsar | 714/720 |

* cited by examiner

Primary Examiner—Trong Phan
(74) Attorney, Agent, or Firm—McCormick, Paulding & Huber LLP

(57) ABSTRACT

A memory array includes a plurality of memory cells logically arranged in M rows and N columns, wherein N is the number of memory cells per word of digital information and M is the number of words within the array. A plurality of N data output lines are associated with each of the N columns of the array for selectively retrieving output data from a word located at a predetermined word address in the array. Each data output line is selectively shared by each of the M memory cells within its associated column. Each of the cell output lines of the M memory cells in each of the N columns are logically OR-ed together to provide the output data retrieved by each data output line associated with each of the N columns.

10 Claims, 4 Drawing Sheets

SYSTEM AND METHOD FOR ACCESSING A MEMORY ARRAY WHICH TOLERATES NON-EXCLUSIVE READ SELECT ENABLES

FIELD OF THE INVENTION

This invention relates generally to a memory array system, and more particularly to a memory array system which permits the accidental simultaneous assertion of a plurality of word addresses without corrupting data stored in the array or otherwise damaging the array.

BACKGROUND OF THE INVENTION

Memory arrays include cells that share data lines for storing digital information to and retrieve digital information from the cells. Each memory cell stores the smallest unit of digital information, known as a "bit". Typically, a predetermined number of bits, such as eight, cooperate to form a larger type of digital information known as a "word". A unique word address is associated with each group of cells that cooperate to store a word of digital information. When a word address is enabled or asserted, digital data can be either stored or retrieved from the group of cells at the word address. During an instruction cycle of a read operation, only a single word address is enabled from among a plurality of word addresses sharing data lines in order to protect the integrity of the data on the shared data lines.

FIG. 1, for example, is a highly schematic illustration of a conventional dual-ended memory array 10 for storing digital information at cells $X_1$ through $X_N$, where there are N cells in the array. Each cell stores a bit of digital information that is either a predetermined low voltage value (logic "0") or a predetermined high voltage value (logic "1"). For simplicity of illustration, a word comprises a single bit of digital information stored in a single cell associated with the word address, but typically a word includes a plurality of bits of digital information stored in a plurality of cells associated with the word address. Each cell includes cross coupled inverters 14a and 14b associated with a unique word address that is enabled via one of the word lines $WL_1$ through $WL_N$. If a word or address line is enabled during a read operation, pass transistors 16a and 16b associated with the cell at the enabled word address are turned on to pass the bit of digital information stored in the cell onto the data or bit line BL, as well as the digitally inverted or complemented value of the bit of information onto the inverted data or bit line BL-INV.

A sense amplifier 18 is coupled between the bit lines BL and BL-INV to measure the difference in voltage therebetween. The voltage between the bit lines BL and BL-INV when only one word address is enabled is different from that when two word addresses are accidentally simultaneously enabled due to a defective operation of a conventional address decoder (not shown). The sense amplifier 18 detects when a defective read operation has occurred and consequently when the retrieved data should be ignored. The data should be ignored because the simultaneous enabling of more than one word address can cause the data stored within the cells to be corrupted. Another drawback with simultaneous enablement of two word addresses is that the memory array can become unstable because cells associated with different word addresses sharing the same bit lines can "fight" one another by simultaneously attempting to pull a bit line up to logic "1" and down to logic "0". This unstable condition can cause the memory array to draw excessive current that results in permanent damage to the memory array.

SUMMARY OF THE INVENTION

An electronic memory system includes a memory array including a plurality of memory cells each storing a bit of digital information. Each memory cell is from among a group of cells associated with a word address and communicates with a read enable line for activating the group of cells associated with the word address for data retrieval during a read operation. Further, each cell communicates with at least one data output line shared by other cells from among other word addresses for data retrieval from the group of cells associated with the enabled word address during a read operation. Bits of digital information retrieved from cells sharing the same data output line during a read operation are logically OR-ed together in order to prevent damage to the memory array or corruption of data stored therein should enablement signals accidentally be sent simultaneously to a plurality of word addresses. Preferably, the system includes dynamic logic to perform the logical OR operation.

In addition, a method is provided for accessing a memory array with a plurality of memory cells each storing a bit of digital information. Each memory cell is from among a group of cells associated with a word address and communicates with a read enable line for activating the group of cells associated with the word address for data retrieval during a read operation. Each cell communicates with at least one data output line shared by other cells from among other word addresses for data retrieval from the group of cells associated with the enabled word address during a read operation. A read enable is asserted during a read operation for retrieving data from a group of cells associated with the enable word address. Bits of digital information retrieved from cells sharing the same data output line during a read operation are logically OR-ed together in order to prevent damage to the memory array or corruption of data stored therein should enablement signals accidentally be sent simultaneously to a plurality of word addresses. Preferably, the system includes dynamic logic for the logical OR function.

The memory array system permits the accidental simultaneous enablement of more than one word address during a read operation without corrupting data stored therein or drawing excessive current which might damage the memory array.

DETAILED DESCRIPTION OF THE INVENTION

Figure 1:
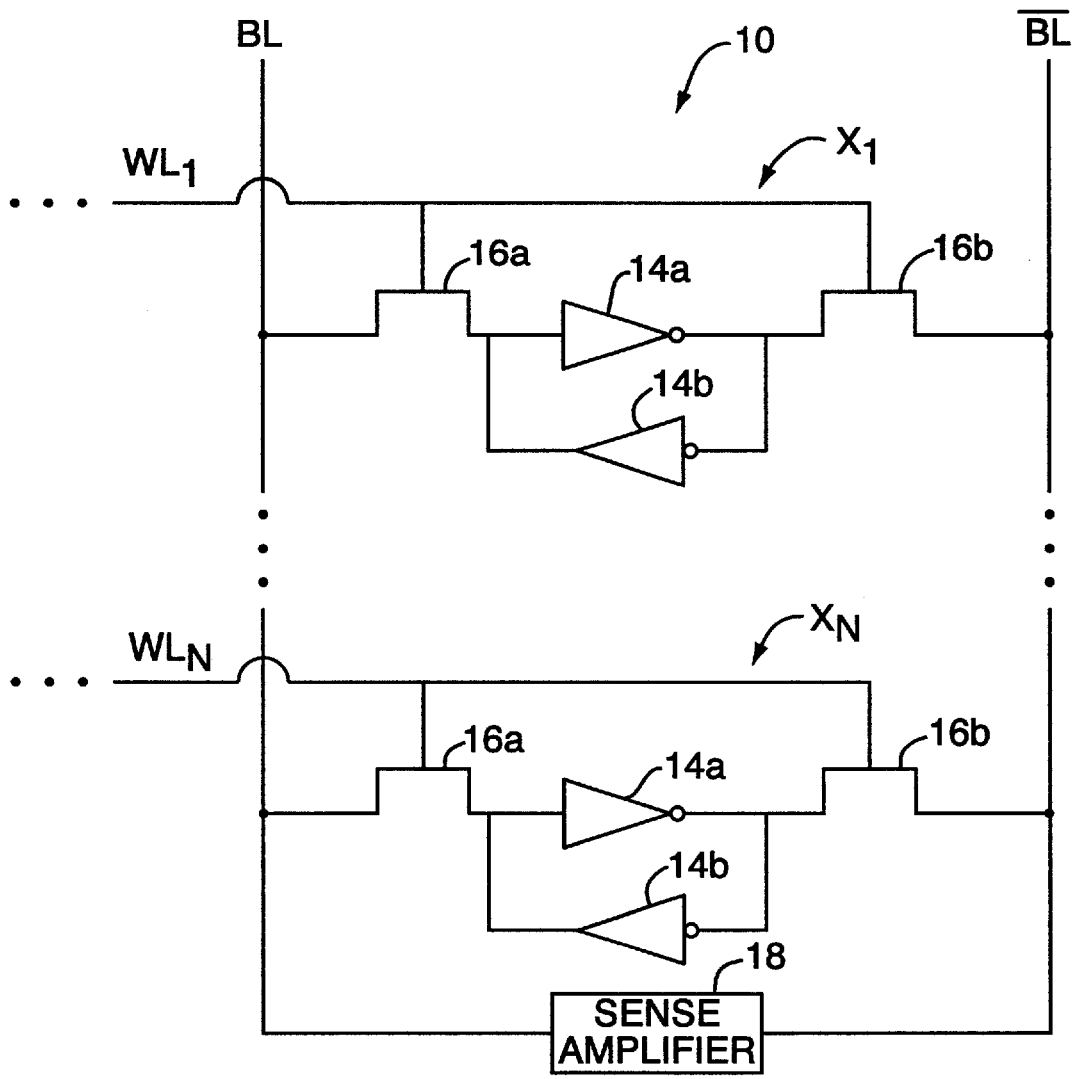
FIG. 1 schematically illustrates a conventional dual-sided memory array.
Figure 2:
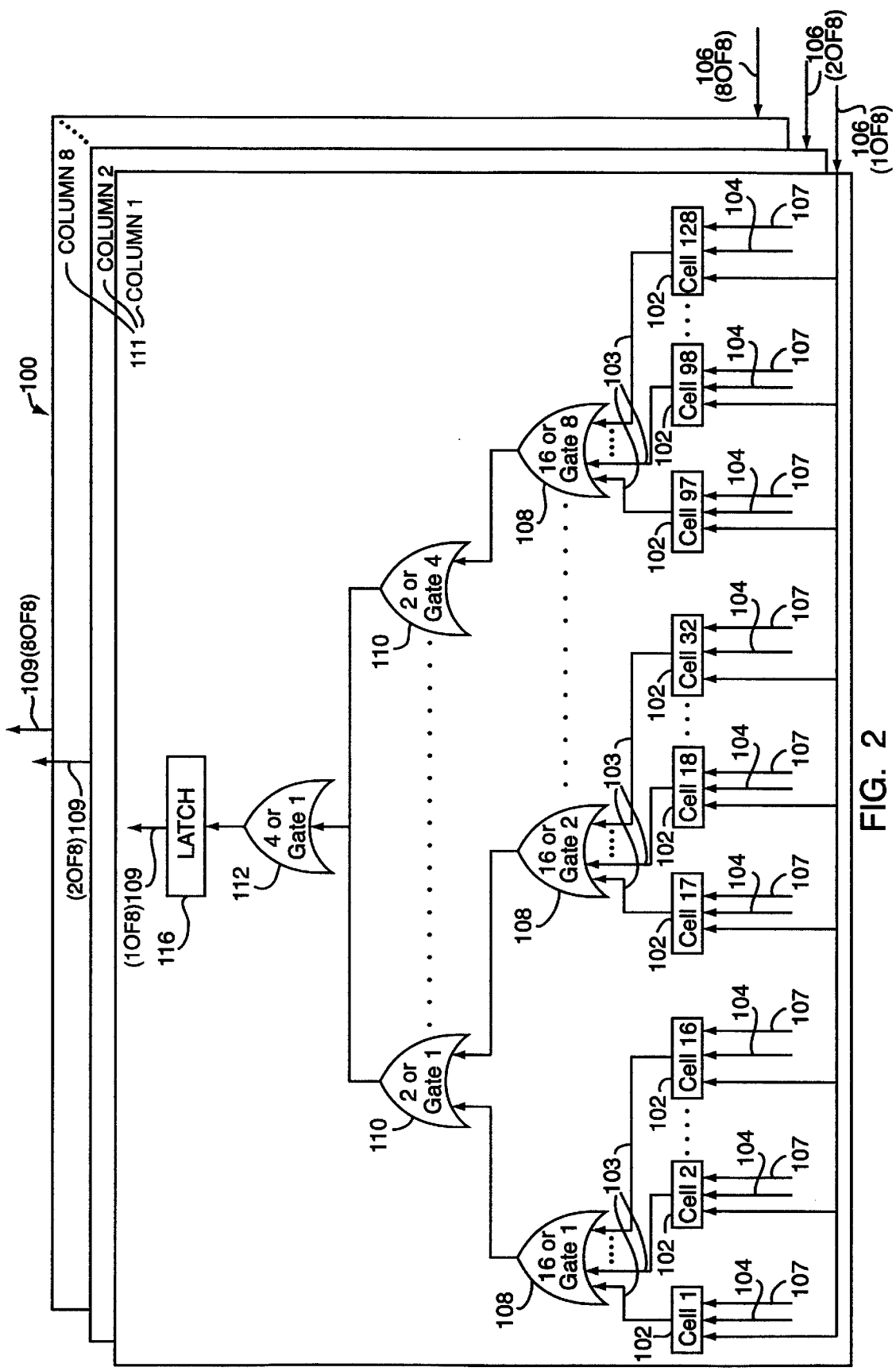
FIG. 2 schematically illustrates a memory array system in accordance with the present invention.

FIG. 2 schematically illustrates a memory array system 100 which permits access to a memory array having a plurality of cells 102, 102 while preventing damage to the array or corruption of data stored in the array during an instruction cycle of a read operation should more than one word address sharing the same data lines be accidentally simultaneously enabled because of a faulty address decoder. The system 100 includes, by way of example, a 128×8 cell array for storing 128 words of digital information, wherein each word includes 8 bits. The memory array may be any practical size without departing from the broader aspects of the present invention. For simplicity of illustration, only one column of the array is fully shown.

Each group of eight cells 102 which cooperate to store a word of digital information at a unique word address is coupled to one of 128 fully decoded write enable lines 104 for permitting a group of eight cells associated with the enabled word address to receive and store digital information during a write operation. When a group of eight cells 102 associated with a word address is enabled via the write enable lines 104, digital information is then stored in these eight cells via eight data input lines 106. Each of the eight data input lines 106 is shared by a corresponding cell associated with the other 127 word addresses within the memory array.

Each group of eight cells 102 which cooperate to store a word of digital information is coupled to eight of 1024 read enable lines 107 for enabling the retrieval of digital information along data output lines 109 from a group of cells associated with the enabled word address during a read operation. Each group of cells 102 associated with a word address is coupled to eight read enable lines 107 to permit eight simultaneous read operations from a single word address. The number of read enable lines associated with a word address may vary without departing from the broader aspects of the present invention.

To produce a stable output and current draw through the memory array should more than one word address be simultaneously enabled, each cell 102 from among the eight cells associated with a word address is logically OR-ed with corresponding cells 102 associated with the other 127 word addresses. As shown in FIG. 2, the OR operation occurs in three stages. The first stage includes eight 16-OR operations 108 (one shown for simplicity of illustration) wherein each first stage OR operation handles the OR-ing together of corresponding cells 102 from among 16 word addresses. The second stage includes four 2-OR operations 110 (one shown for simplicity of illustration) wherein each second stage OR operation handles the OR-ing together of the outputs of two of the first stage OR operations. The third stage includes one 4-OR operation 112 wherein the third stage OR operation handles the OR-ing together of the four outputs of the second stage OR operation.

Preferably, the first stage OR operation is realized using dynamic or, more specifically, dynamic domino CMOS logic which is well known in the art of computer logic. The second stage OR operation is preferably realized using static logic, and the third stage is preferably realized by dynamic logic. The output 114 of the third stage OR operation is preferably held in its logic state by a latch 116 for use by a microprocessor (not shown). The three stages of logic just described are well known in the art of computer logic and are referred to as a split or two stage domino structure.

Dynamic logic is a clocked logic which operates in two separate phases during each clock cycle controlled by a system clock: a pre-charge phase and an evaluation phase. The data lines retrieving digital information from the memory array are coupled to one another. The lines are first pre-charged to a high logic level during the pre-charge phase of the clock cycle. The pre-charge is then removed and thereafter the pre-charged lines coupled to one another are in effect logically OR-ed together during an evaluation phase of the clock cycle.

In operation, should an address decoder (not shown) accidentally simultaneously enable two word addresses sharing data lines, the OR operations will limit the draw of current through the memory array to prevent damage thereto, and will quickly stabilize the output of the array to prevent corruption of the digital information stored therein.

Figure 3:
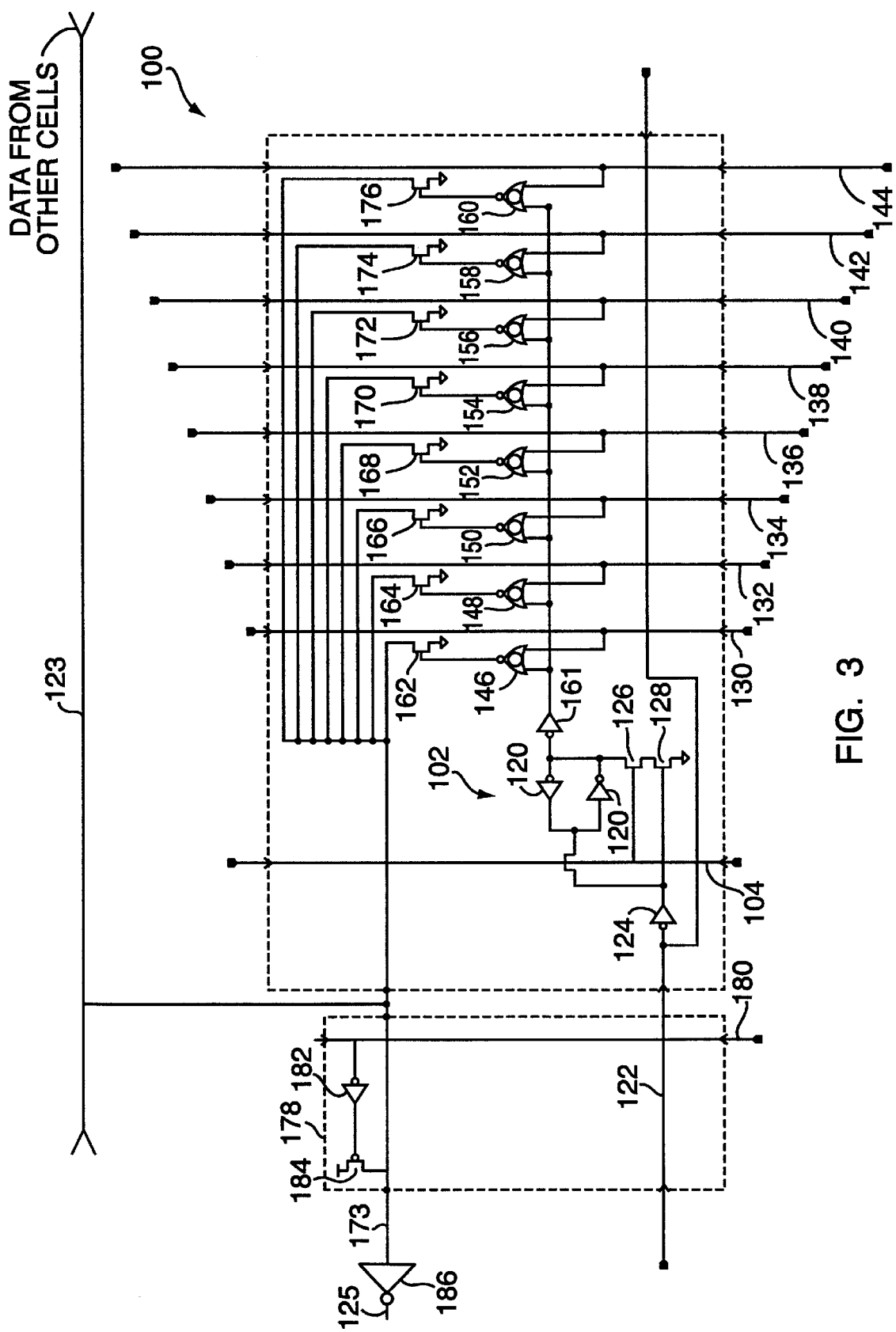
FIG. 3 schematically illustrates in higher detail a portion of the memory array system of FIG. 2.
Figure 4:
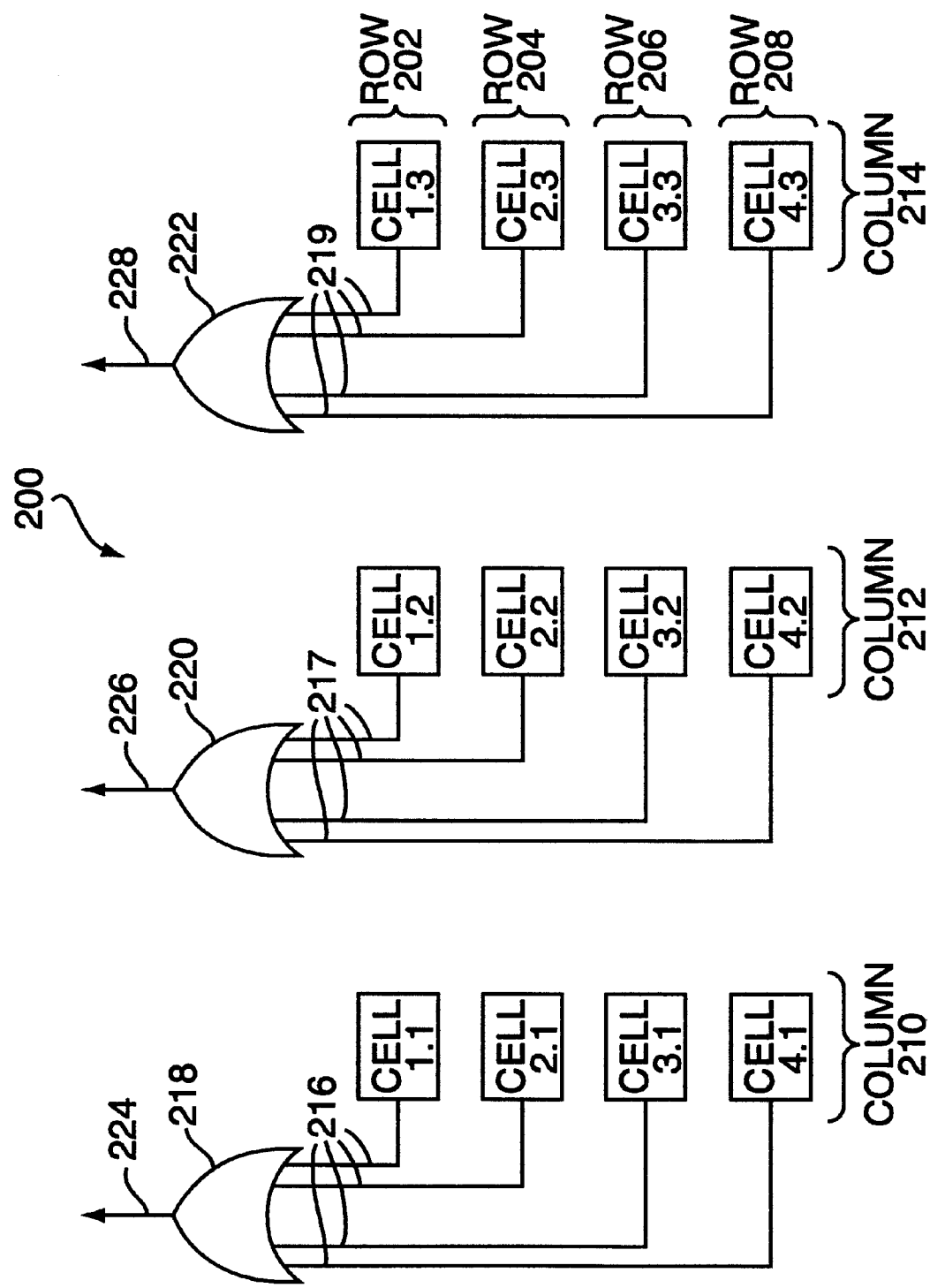

Turning now to FIG. 3, a preferred embodiment of the memory array system of FIG. 2 will be described in greater detail for a portion of the array. The embodiment shows an implementation of a first stage logical OR operation performed on the outputs of the cells 102 using dynamic logic. For simplicity of illustration, only one cell 102 is fully shown although the other cells are coupled in an array form to the data and enable lines in a known manner. FIG. 3 shows in notation form the OR-ing together of cells from among eight word addresses which are contained in a memory sub-element or module. Another module (not shown) has a data output line communicating with the data output line of the shown memory module to form a first stage 16-OR operation as previously described with respect to FIG. 2. The data outputs from among the other 112 word addresses are OR-ed together in the three stages shown in FIG. 2.

Each cell 102 of the memory array system 100 preferably includes cross-coupled inverters 120 for storing a bit of digital information via data input lines 122. Each of the data input lines 122 is coupled to corresponding cells 102 from among seven other word addresses within an 8×8 sub-element or module of the 8×128 cell memory array. Each data input line 122 may be coupled to an adjacent data line (not shown) that serves another 8×8 module. Alternatively, the data input line 122 may directly serve corresponding cells from all 128 word addresses as generally described with respect to FIG. 2 or any sub-combination thereof without departing from the broader aspects of the present invention. Each data input line 122 may include a local inverter 124 within each cell 102 for damping noise caused by the length of the data line 102 extending through the corresponding cells 102 from among the eight word addresses in the memory array module.

Each group of eight cells 102 at a word address is enabled for a write operation by a distinct write enable line 104. The write enable lines 104 turn on a pair of NMOS transistors 126, 128 which, in turn, enable the cross coupled inverters 120 to receive and store a bit of the digital information carried on one of the associated eight data input lines 122 serving the enabled word address. Further, each group of eight cells 102 at a word address may be simultaneously enabled during a read operation by as many as eight read enable lines 130, 132, 134, 136, 138, 140, 142 and 144.

The read enable lines 130 through 144 are respectively coupled to first inputs of two input NOR gates 146, 148, 150, 152, 154, 156, 158 and 160. The other inputs of the NOR gates 146 through 160 are coupled to the output of the cross coupled inverters 120 of the associated cell 102. An inverter 161 may be interposed between each cell 102 and the second inputs of the NOR gates 146 through 160 to prevent noise from going back to the cross coupled inverters 120 should several or all of the read enable lines 130 through 144 be simultaneously enabled. The outputs of the NOR gates 146 through 160 are coupled to the base of respective pass transistors 162, 164, 166, 168, 170, 172, 174 and 176. The emitters of the pass transistors 162 through 176 are coupled to ground potential, and the collectors of the pass transistors are coupled in parallel with one another to form a data output line 123 serving the illustrated cell 102 and the corresponding cells from among the other seven word addresses within the 8×8 memory array sub-element or module. Seven other data output lines likewise serve the other seven bits cooperating to form a word of digital information.

Each data output line 123 is coupled to a pre-charge device 178 which includes a clock line 180, an inverter 182 and a transistor 184. More specifically, the clock line 180 is coupled to the input of the inverter 182. The output of the inverter 182 is coupled to the base of the pre-charge transistor 184. The collector of the transistor 184 is coupled to a digital high voltage, and the emitter of the transistor 184 is coupled to the data output line 123. As will be explained more fully below, the digital voltage level of each data output line 123 is inverted by a corresponding output inverter 186 so that the memory array system performs a logical OR operation on the bits of digital information output from the cells sharing data output lines to produce a stable memory array operating state.

The operation of the memory array system shown in FIG. 3 during a pre-charge phase of an instruction cycle will now be briefly explained. Pre-charge of the data output line 123 occurs during the low state of the clock input to the pre-charge device 178. The low clock signal is received by the input of the inverter 182 via the clock line 180. The output of the inverter 182 coupled to the base of the pre-charge transistor 184 goes high thereby turning on the transistor 184 so as to pull the data output line 123, coupled to the emitter of the transistor 184, up to a high or pre-charged state immediately prior to the evaluation phase of the clock cycle.

The operation of the memory array system will now be briefly explained during the second or evaluation phase of the clock cycle. As will be explained in detail below, during the evaluation phase, the pre-charge transistor 184 is turned off such that the data output line 123 coupled to the transistor 184 will stay high unless pulled down to a low state should one or more of the pass transistors 162 through 176 be turned on from the illustrated cell 102 or from among the other seven cells 102 sharing the same data output line.

During a write operation at an evaluation phase, each write enable line 104 is enabled (logic level "1") which turns on the bias transistors 126, 128 for each cell 102 to thereby permit digital information on the data input lines 122 to be stored in the eight cells associated with the enabled word address.

During a read operation at an evaluation phase, at least one of the read enable lines 130 through 144 serving the eight cells 102 of a word address is enabled or asserted (logic level "1"). If, however, none of the read enable lines 130 through 144 is asserted, the first inputs to the NOR gates 146 through 160 are high which generate a low output at the NOR gates regardless of the value stored in the associated cell 102. The pass transistors 162 through 176 all remain off such that the collectors of the transistors coupled to the data output line at 123 do not effect the data output line 123 in the pre-charged high state.

If at least one of the read enable lines 130 through 144 is enabled (logic level "0"), the first input is low to the enabled one of the NOR gates 146 through 160. When the cell 102 stores a logic "0" or is low, this value is complemented at the inverter 161 so as to feed a high logic signal to the second inputs of the NOR gates. The enabled NOR gate thus receives digital inputs of "0" and "1" at its first and second inputs to thereby generate a logic level of "0" at its output. The low state at the output of the enabled NOR gate maintains the associated one of the pass transistors 162 through 176 in an off state along with the other pass transistors associated with the non-enabled NOR gates to thereby maintain the data output line 123 coupled to the collectors of the pass transistors at the pre-charged high state. The logic level of the data output line is complemented by the output inverter 186 such that the value along the data output line at the point 125 is low which is, as expected, the same value stored in the cell 102.

Likewise, if at least one of the read enable lines 130 through 144 is enabled (logic level "0") and the cell 102 stores a logic "1" or is high, this value is complemented at the inverter 161 so as to feed a low logic signal to the second inputs of the NOR gates. The enabled NOR gate thus receives digital inputs of "0" and "0" at its first and second inputs to thereby generate a logic level of "1" at its output. The high state at the output of the enabled NOR gate turns on the associated one of the pass transistors 162 through 176 to thereby pull down or maintain the collector of the pass transistor and the data output line 123 coupled thereto to ground potential or a low state. The logic value of the data output line at 123 is complemented by the output inverter 186 such that the value of the data output line at the point 125 is high which is, as expected, the same value stored in the cell 102.

The memory system using dynamic logic in effect operates as a logical OR gate at two levels. The first level is at the level of each cell 102. As was demonstrated, it takes only one of the eight read enable lines 130 through 144 to be asserted in order to pull the data output line 123 to a low state when the cell 102 stores a bit at logic level "1". This results in a logical NOR operation; however, the output inverter 186 complements the above-mentioned NOR operation, thereby overall accomplishing a logical OR operation having a logic output at point 125 along the data output line.

As mentioned above, the memory system using dynamic logic also acts as a logical OR gate at a second level. The second level is at the level of the eight cells 102 from among the eight word addresses of the 8×8 module sharing the same data lines. If any one of the pass transistors 162 through 176 associated with any of the other cells 102 coupled to the same data output line 123 is turned on, the data output line at 123 is pulled to ground potential or a low level. This results in a logical NOR operation; however, the output inverter 186 complements the above-mentioned NOR operation, thereby overall accomplishing a logical OR operation having a logical output at point 125 along the data output line.

As was demonstrated above, the use of a dynamic OR operation to the memory array results in a stable output along the data output lines. The stability prevents excessive current draw through the memory array should more than one word address sharing the same data lines be accidentally simultaneously enabled because of a defective address decoder operation. Further, the stable data output of the memory array system embodying the present invention prevents the memory cells from being corrupted during a read operation where more than one word address is simultaneously enabled.

Although the invention has been shown and described above, it should be understood that numerous modifications can be made without departing from the spirit and scope of the present invention. Accordingly, the present invention has been shown and described by way of illustration rather than limitation.

What is claimed is:

1. A memory array for storing and retrieving a plurality of words of digital information, the memory array comprising:
   a plurality of memory cells each storing a bit of digital information and each having a cell output line, the cells being logically arranged in M rows and N columns, wherein N is the number of memory cells per word of digital information and M is the number of words within the array;

a plurality of N data output lines, each data output line associated with a single one of the N columns of the array for selectively retrieving output data from a word located at a predetermined word address in the array, wherein each data output line is selectively shared by each of the M memory cells within its associated column; and wherein each of the cell output lines of the M memory cells in each of the N columns are logically OR-ed together to provide the output data retrieved by each data output line associated with each of the N columns.

2. An electronic memory system as defined in claim 1, wherein the memory array is single-sided.

3. An electronic memory system as defined in claim 1, wherein the OR-ing logic includes dynamic logic.

4. An electronic memory system as defined in claim 1, wherein the OR-ing logic includes dynamic domino CMOS logic.

5. An electronic memory system as defined in claim 3, wherein the OR-ing logic includes a pre-charge device coupled to each shared data output line.

6. An electronic memory system as defined in claim 5, wherein the pre-charge device includes an inverter having an input and an output, and a transistor having a base, collector and emitter, the input of the inverter being coupled to a clocked line, the output of the inverter being coupled to the base of the transistor, the collector of the transistor being coupled to a digital high voltage, and the emitter of the collector being coupled to an associated data output line.

7. A method of retrieving data from a memory array, comprising the steps of:

providing a plurality of memory cells each storing a bit of digital information and each having a cell output line, the cells being logically arranged in M rows and N columns of an array, wherein N is the number of memory cells per word of digital information and M is the number of words within the array;

providing a plurality of N data output lines, each data output line associated with a single one of the N columns of the array for selectively retrieving output data from a word located at a predetermined word address in the array, wherein each data output line is selectively shared by each of the M memory cells within its associated column;

asserting a read enable during a read operation for enabling a word at a predetermined word address;

outputting the bits of digital information from each cell of the enabled word onto the cell's respective cell output lines; and logically Or-ing together each of the cell output lines of the M memory cells in each of the N columns to provide the output data retrieved by each data output line associated with each of the N columns.

8. A method for accessing a memory array as defined in claim 7, wherein the memory array is single-sided.

9. A method for accessing a memory array as defined in claim 7, wherein the step of logically OR-ing includes dynamic logic.

10. A method for accessing a memory array as defined in claim 7, wherein the step of logically OR-ing includes dynamic domino CMOS logic.

* * * * *